(12) United States Patent
Niemann

(10) Patent No.: US 12,704,532 B2
(45) Date of Patent: Aug. 11, 2026

(54) AUTOMATIC CURRENT RANGING SYSTEM

(71) Applicant: Analog Devices, Inc., Wilmington, MA (US)

(72) Inventor: James Alan Niemann, Chagrin Falls, OH (US)

(73) Assignee: Analog Devices, Inc., Wilmington, MA (US)

( * ) Notice: Subject to any disclaimer, the term of this patent is extended or adjusted under 35 U.S.C. 154(b) by 168 days.

(21) Appl. No.: 18/818,117

(22) Filed: Aug. 28, 2024

(65) Prior Publication Data

US 2026/0063686 A1 Mar. 5, 2026

(51) Int. Cl.

| | |
|---|---|
| ***G01R 19/25*** | (2006.01) |
| ***G01R 1/067*** | (2006.01) |
| ***G01R 1/073*** | (2006.01) |
| ***G01R 1/20*** | (2006.01) |
| ***G01R 15/00*** | (2006.01) |
| ***G01R 15/09*** | (2006.01) |
| ***G01R 15/12*** | (2006.01) |

(52) U.S. Cl.

CPC .................................... *G01R 19/25* (2013.01)

(58) Field of Classification Search

CPC ........ G01R 19/25; G01R 15/00; G01R 15/09; G01R 15/12; G01R 1/067; G01R 1/073; G01R 1/20

See application file for complete search history.

(56) References Cited

U.S. PATENT DOCUMENTS

| | | | | |
|---|---|---|---|---|
| 7,923,985 B2 * | 4/2011 | Goeke | .................... | G01R 15/09 324/115 |
| 9,453,880 B2 * | 9/2016 | Goeke | .................... | G01R 1/203 |
| 2005/0128657 A1 * | 6/2005 | Covault | ................. | H02H 3/087 361/18 |
| 2023/0288448 A1 | 9/2023 | Goeke et al. | | |

FOREIGN PATENT DOCUMENTS

| | | |
|---|---|---|
| JP | 6663165 B2 | 3/2020 |

OTHER PUBLICATIONS

Extended European Search Report for Application No. 25189364.0, dated Dec. 8, 2025, 7 Pages.

* cited by examiner

*Primary Examiner* — Neel D Shah
(74) *Attorney, Agent, or Firm* — DLA Piper LLP (US)

(57) ABSTRACT

A current measurement system, comprising a plurality of parallel sensing circuits, each sensing circuit configured to measure a respective range of voltage corresponding to a current through a load, wherein each sensing circuit is triggered to initiate measurement of a voltage across the load in response to a buffer current through a common buffer reaching a respective threshold, a buffer circuit for inputting a virtual ground voltage or a virtual ground current to the load and to the plurality of parallel sensing circuits, the virtual ground voltage corresponding to the voltage across the load or the current through the load, and a processor coupled to the plurality of parallel sensing circuits, wherein the processor is configured to combine data representing voltage measurements from the plurality of parallel sensing circuits to determine the current through the load.

20 Claims, 5 Drawing Sheets

AUTOMATIC CURRENT RANGING SYSTEM

FIELD

The present disclosure generally relates to an automatic current ranging system. This system provides continuous and uninterrupted measurement of electrical currents across a wide range of magnitudes without manual intervention or switching between discrete measurement ranges.

BACKGROUND

Electrical current measurement systems are widely used in various fields, including electronics testing, power management, and scientific research. These systems typically employ either series or parallel ranging topologies to measure currents across different magnitudes. In series ranging systems, multiple measurement resistors are placed in series, with switches to bypass higher value resistors for larger currents. Parallel ranging systems, on the other hand, switch measurement resistors in parallel to accommodate increasing current levels. Both approaches allow for measurement across a wide range of currents by selecting appropriate resistors or combinations thereof.

However, existing current measurement systems face several limitations. Series and parallel ranging topologies often require real-time switching based on the actual current being measured, which can introduce discontinuities and errors at range boundaries. This switching can also lead to momentary interruptions in the measurement process. Additionally, many systems struggle to provide accurate measurements across their range, particularly when dealing with both small and large currents simultaneously. The need for guarding in low current ranges further complicates circuit design and can introduce additional sources of error. Furthermore, existing systems often have difficulty measuring small changes in large currents without sacrificing accuracy or resolution.

SUMMARY

This summary is provided to introduce a selection of concepts in a simplified form that are further described below in the detailed description. This summary is not intended to identify essential features of the claimed subject matter, nor is it intended to be used as an aid in determining the scope of the claimed subject matter.

In one aspect, the present disclosure relates to a current measurement system, comprising a plurality of parallel sensing circuits, each sensing circuit configured to measure a respective range of voltage corresponding to a current through a load, wherein each sensing circuit is triggered to initiate measurement of a voltage across the load in response to a buffer current through a common buffer reaching a respective threshold, a buffer circuit for inputting a virtual ground voltage or a virtual ground current to the load and to the plurality of parallel sensing circuits, the virtual ground voltage corresponding to the voltage across the load or the current through the load, and a processor coupled to the plurality of parallel sensing circuits, wherein the processor is configured to combine data representing voltage measurements from the plurality of parallel sensing circuits to determine the current through the load.

In embodiments of this aspect, the disclosure according to any one of the above example embodiments, each sensing circuit of the plurality of parallel sensing circuits comprises an amplifier with a predetermined gain, and wherein the respective threshold at which each sensing circuit of the plurality of parallel sensing circuits initiates the measurement is determined by the predetermined gain of its amplifier.

In embodiments of this aspect, the disclosure according to any one of the above example embodiments, the plurality of parallel sensing circuits are configured such that sensing circuits of the plurality of parallel sensing circuits measuring smaller ranges of the voltage across the load remain active when sensing circuits of the plurality of parallel sensing circuits measuring larger ranges of the voltage across the load or the current through the load are initiated.

In embodiments of this aspect, the disclosure according to any one of the above example embodiments, the respective ranges of the voltage across the load or the current through the load measured by the plurality of parallel sensing circuits are configured to collectively form a logarithmic scale of the measurement across the combined range of the system.

In embodiments of this aspect, the disclosure according to any one of the above example embodiments, the buffer circuit inputs the virtual ground voltage to an output of an amplifier, wherein the amplifier varies a voltage at its power terminals to provide the virtual ground voltage or the virtual ground current to the plurality of parallel sensing circuits.

In embodiments of this aspect, the disclosure according to any one of the above example embodiments, each sensing circuit of the plurality of parallel sensing circuits comprises an offset control configured to zero the respective sensing circuit of the plurality of parallel sensing circuits.

In embodiments of this aspect, the disclosure according to any one of the above example embodiments, a feedback loop is configured to adjust the virtual ground voltage or the virtual ground current of the plurality of parallel sensing circuits in response to changes in the current through the load.

In embodiments of this aspect, the disclosure according to any one of the above example embodiments, a feedback loop is configured to adjust the virtual ground voltage or the virtual ground current such that the voltage across the load or the current through the load corresponds to a desired reference voltage.

In one aspect, the present disclosure relates to a method of measuring current, comprising measuring, by each of a plurality of parallel sensing circuits, a respective range of voltage corresponding to a current through a load, wherein each sensing circuit is triggered to initiate measurement of a voltage across the load or the current through the load in response to a buffer voltage or a buffer current on a common buffer reaching a respective threshold, inputting, by a buffer circuit, a virtual ground voltage or a virtual ground current corresponding to the voltage across the load or the current through the load to the plurality of parallel sensing circuits, and combining, by a processor coupled to the plurality of parallel sensing circuits, data representing voltage measurements from the plurality of parallel sensing circuits to determine the current through the load.

In embodiments of this aspect, the disclosure according to any one of the above example embodiments, each sensing circuit of the plurality of parallel sensing circuits comprises an amplifier with a predetermined gain, and wherein the respective threshold at which each sensing circuit of the plurality of parallel sensing circuits initiates the measurement is determined by the predetermined gain of its amplifier.

In embodiments of this aspect, the disclosure according to any one of the above example embodiments, sensing circuits of the plurality of parallel sensing circuits measuring smaller ranges of the voltage across the load remain active when sensing circuits of the plurality of parallel sensing circuits measuring larger ranges of the voltage across the load or the current through the load are initiated.

In embodiments of this aspect, the disclosure according to any one of the above example embodiments, the respective ranges of the voltage across the load or the current through the load measured by the plurality of parallel sensing circuits collectively form a logarithmic scale of the measurement across the combined range of the plurality of parallel sensing circuits.

In embodiments of this aspect, the disclosure according to any one of the above example embodiments, inputting the virtual ground voltage comprises inputting the virtual ground voltage to an output of an amplifier, wherein the amplifier varies a voltage at its power terminals to provide an output voltage or the virtual ground current to the plurality of parallel sensing circuits.

In embodiments of this aspect, the disclosure according to any one of the above example embodiments, further comprising zeroing each sensing circuit of the plurality of parallel sensing circuits using an offset control.

In embodiments of this aspect, the disclosure according to any one of the above example embodiments, further comprising adjusting the virtual ground voltage or the virtual ground current of the plurality of parallel sensing circuits in response to changes in the current through the load.

In embodiments of this aspect, the disclosure according to any one of the above example embodiments, further comprising adjusting the virtual ground voltage or the virtual ground current such that the voltage across the load or the current through the load corresponds to a desired reference voltage.

In one aspect, the present disclosure relates to a method for testing operation of an electronic device, comprising measuring, by each of a plurality of parallel sensing circuits, a respective range of voltage corresponding to a current through the electronic device, wherein each sensing circuit is triggered to initiate measurement of a voltage across the electronic device in response to a buffer current through a common buffer reaching a respective threshold, inputting, by a buffer circuit, a virtual ground voltage or a virtual ground current to the electronic device and to the plurality of parallel sensing circuits, the virtual ground current corresponding to the voltage across the electronic device or the current through the electronic device, combining, by a processor coupled to the plurality of parallel sensing circuits, data representing voltage measurements from the plurality of parallel sensing circuits to determine the current through the electronic device, and analyzing the current to determine if the operation of the electronic device passes meets predetermined criteria.

In embodiments of this aspect, the disclosure according to any one of the above example embodiments, each sensing circuit of the plurality of parallel sensing circuits comprises an amplifier with a predetermined gain, and wherein the respective threshold at which each sensing circuit of the plurality of parallel sensing circuits initiates the measurement of the voltage across the electronic device is determined by the predetermined gain of its amplifier.

In embodiments of this aspect, the disclosure according to any one of the above example embodiments, sensing circuits of the plurality of parallel sensing circuits measuring smaller ranges of the voltage across the electronic device remain active when sensing circuits of the plurality of parallel sensing circuits measuring larger ranges of the voltage across the electronic device or the current through the electronic device are initiated.

In embodiments of this aspect, the disclosure according to any one of the above example embodiments, the respective ranges of the voltage across the electronic device or the current through the electronic device measured by the plurality of parallel sensing circuits collectively form a logarithmic scale of the measurement across the combined range of the plurality of parallel sensing circuits.

The foregoing general description of the illustrative embodiments and the following detailed description thereof are merely exemplary aspects of the teachings of this disclosure and are not restrictive.

BRIEF DESCRIPTION OF THE DRAWINGS

So that the way the above-recited features of the present disclosure can be understood in detail, a more particular description of the disclosure, briefly summarized above, may be made by reference to example embodiments, some of which are illustrated in the appended drawings. It is to be noted, however, that the appended drawings illustrate only example embodiments of this disclosure and are therefore not to be considered limiting of its scope, for the disclosure may admit to other equally effective example embodiments.

DETAILED DESCRIPTION

Figure 1:
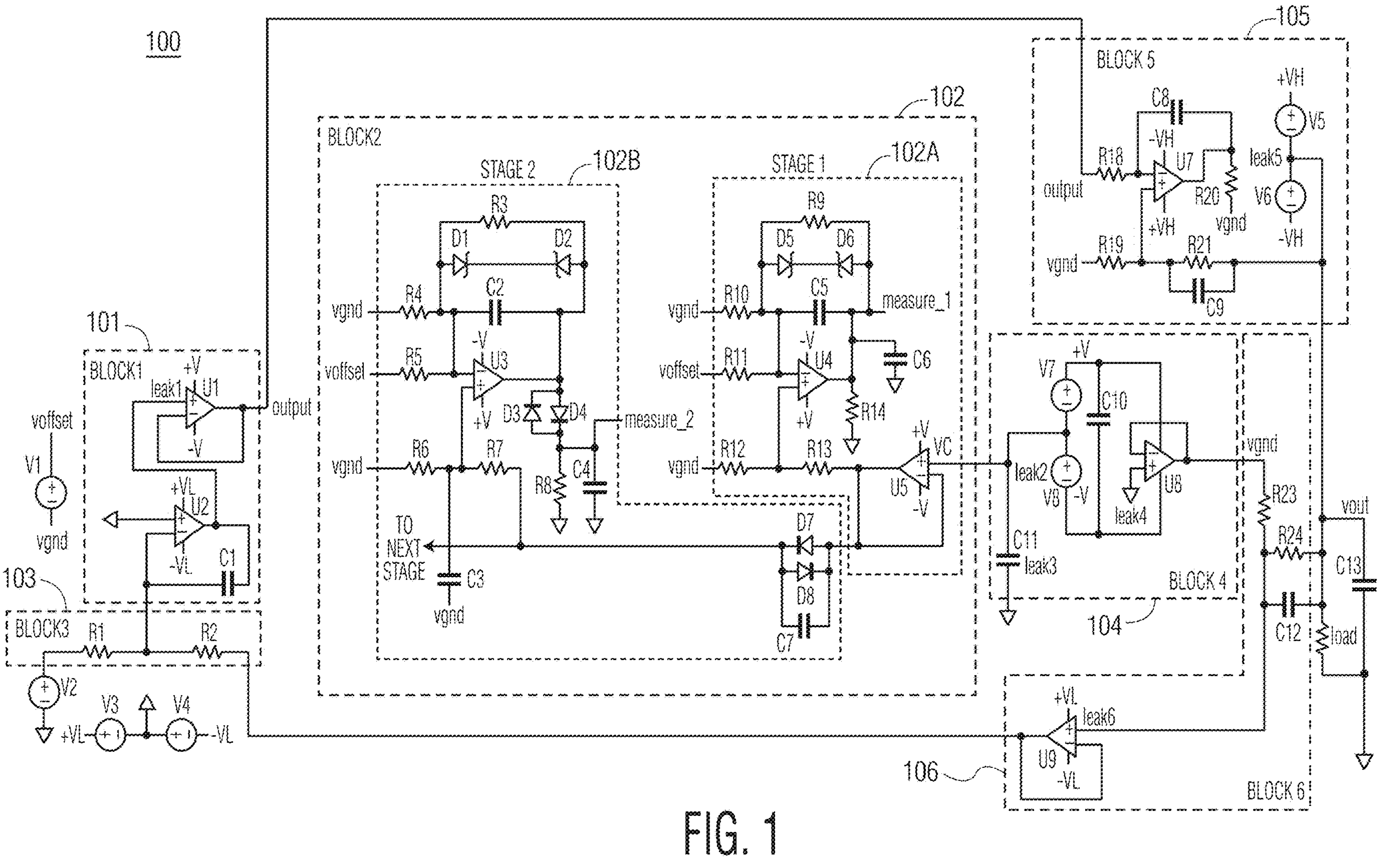
FIG. 1 illustrates an auto-ranging circuit for current measurement across multiple ranges, according to aspects of the present disclosure.

The present disclosure provides an electrical current measurement system that offers a solution to measuring electrical currents across a wide range of magnitudes. This system may incorporate a plurality of parallel sensing circuits, each configured to measure a respective range of voltage corresponding to a current through a load. Each sensing circuit may be triggered to initiate measurement of a voltage across the load in response to the current through a common buffer reaching a respective threshold. This configuration may allow for simultaneous measurement across multiple current ranges without the need for switching, a common limitation in existing current measurement systems. A processor may be coupled to the plurality of parallel sensing circuits is configured to combine digital data representing voltage measurements from the plurality of parallel sensing circuits to determine the current through the load. The system may incorporate two separate, non-interacting feedback loops: a current feedback loop and a voltage feedback loop, both utilizing a virtual ground (vgnd) buffer described in more detail below. This arrangement may enable continuous and accurate current measurement capability, enhancing the precision and reliability of current measurements. In one example, the current feedback loop controls the load current as the dependent variable of interest, while the voltage feedback loop maintains the output voltage constant with respect to system ground. However, the system may be configured to invert these roles, allowing voltage to be the dependent variable in some implementations. This arrangement offers flexibility in system configuration and operation. For example, in cases where current control is beneficial, such as in battery charging or LED driver applications, the current feedback loop may act as the primary control mechanism. The system may adjust the load current to maintain a desired setpoint, while the voltage feedback monitors and controls the output voltage for accurate measurements. Conversely, in applications where voltage regulation is beneficial, such as in power supply design or voltage-sensitive device testing, the system may be configured to prioritize voltage control. In this configuration, the voltage feedback loop may actively regulate the load voltage to a specified level, while the current feedback loop monitors and limits the current to prevent overload conditions. The ability to switch between current-controlled and voltage-controlled modes may enhance the system's versatility across different testing scenarios.

In embodiments of this aspect, the system may allow a user to set a desired load voltage through a load such as a device under test (DUT). The system includes a feedback path that compares the desired load voltage to the actual load voltage. This feedback path may balance the desired and actual voltages by injecting current into the common buffer. The injection of current into the common buffer may cause current to flow between system ground and the high voltage supplies, thereby controlling the load current. This arrangement may enable precise control over the load voltage and current, enhancing the system's ability to maintain stable and accurate measurements across various operating conditions.

In some cases, the feedback path may continuously monitor the difference between the desired and actual load voltages. The output of this comparison may be used to adjust the current injection into the common vgnd buffer, creating a closed-loop control system. This closed-loop control may allow the system to respond quickly to changes in load conditions or user input, maintaining the desired load voltage with high precision. It is noted that the feedback loop may continuously monitor and adjust the output voltage to maintain it at a constant level regardless of changes in the load current. Again, these two non-interacting feedback loops operate independently, allowing the system to precisely control load current while maintaining a stable voltage reference.

Electrical current injection into the common buffer may be ramped up or down gradually to avoid sudden changes in load voltage or current. This feature may be particularly useful in applications where stable and predictable load conditions are beneficial, such as in sensitive electronic testing or power supply characterization.

The system disclosed herein offers several potential advantages over existing current measurement systems. For instance, it may provide improved accuracy across a wide range of currents, seamless operation without the need for range switching, and the ability to measure both positive and negative load voltages. In some aspects, a logarithmic scale of measurement ranges may be implemented through the selection of circuit values, particularly the measurement resistors in each sensing circuit. For example, the measurement resistor in the low range measurement stage may have a value that is ten times larger than the measurement resistor in the high range measurement stage. This configuration allows the low range stage to measure currents that are one-tenth the magnitude of those measured by the high range stage. Additional stages may be added with measurement resistors scaled by factors of ten, creating a logarithmic progression of measurement ranges. This logarithmic scaling may enable the system to accurately measure currents spanning several orders of magnitude, from microamps to amps, without the need for manual range switching or interruption in measurement. These features may make the system particularly useful in various applications, such as electronics testing, power management, and scientific research, where accurate and reliable current measurement is beneficial.

The current measurement system described in this disclosure may find applications in a wide range of fields and industries. It may be particularly useful in electronics testing, power management, scientific research, semiconductor characterization, battery testing, solar panel efficiency analysis, electric vehicle development, medical device testing, aerospace systems, telecommunications equipment testing, and industrial process control. The system's ability to provide accurate measurements across a wide range of currents, from microamps to amps, without interruption or manual switching, makes it versatile enough to be employed in various scenarios where precise current measurement is beneficial for performance evaluation, quality control, or safety monitoring.

For example, in the context of testing DUTs, the system's advantages may be particularly beneficial. For instance, the improved accuracy across a wide range of currents may allow for more precise characterization of DUTs with varying power requirements or operating modes. This capability may be especially useful when testing complex integrated circuits or power management systems that operate across multiple power states.

The seamless operation without the need for range switching may enable continuous monitoring of DUT performance during transitions between different operating modes or power states. This feature may be beneficial when testing devices that rapidly switch between low-power and high-power states, such as mobile processors or internet of things (IoT) devices with sleep modes. The system's ability to capture these transitions without interruption may provide beneficial insights into the DUT's dynamic behavior and power consumption patterns.

Furthermore, the ability to measure both positive and negative load voltages may be advantageous when testing bidirectional power systems or devices with regenerative capabilities, such as motor controllers or energy harvesting circuits. This feature may allow for comprehensive characterization of the DUT's behavior under various load conditions, including scenarios where power may flow in either direction.

In electronics testing applications, the system's capabilities may enable more efficient and thorough validation of DUTs. For example, it may allow for automated testing across a wide range of operating conditions without the need for manual intervention to adjust measurement ranges. This may lead to faster test cycles and more comprehensive test coverage, potentially improving product quality and reducing time-to-market.

In power management applications, the system's high accuracy and wide measurement range may facilitate the development and optimization of energy-efficient devices. It may allow engineers to precisely measure and analyze power consumption patterns, helping to identify opportunities for power optimization in various operating modes.

For scientific research applications, the system's capabilities may enable more detailed and accurate studies of electrical phenomena across a wide range of current magnitudes. This may be particularly beneficial in fields such as materials science, where precise current measurements may be beneficial for characterizing novel materials or devices.

Having discussed various applications and advantages of the current measurement system, the details of the circuit will now be described to provide a comprehensive explanation of the circuit's components, their interconnections, and their functions, offering insights into how the system achieves its high-precision, wide-range current measurement capabilities. The following description will delve into the specifics of the auto-ranging circuit, including its parallel sensing circuits, feedback paths, and control mechanisms, to provide a clear understanding of the system's operation and design principles.

FIG. 1 illustrates an auto-ranging circuit 100 for current measurement across multiple ranges. The circuit may include six functional blocks, each serving a function in the measurement process.

Block 1 101 may include amplifiers that form the low voltage gain stage for the main feedback loop. This block may amplify the error signal from Block 3 103, increasing its magnitude to a level suitable for driving the subsequent high voltage gain stage.

Block 2 102 may contain two measurement stages: Stage 1 102A and Stage 2 102B. These stages may be designed to measure different ranges of load current. As the input current increases, Stage 1 102A may activate to measure a lower current range, while Stage 2 102B may activate to measure a higher current range. This arrangement may allow for simultaneous measurement across different current ranges without switching.

Block 3 103 may include resistors that form the comparison node of the main loop feedback network. This block may compare the desired voltage set by a voltage source with the actual load voltage, generating a low voltage signal that represents the difference between the desired and actual load voltages.

Block 4 104 may act as a virtual ground (vgnd) buffer and may provide a stable interface between the ranging arrangement and the high voltage gain stage. This block may include an amplifier and capacitors to buffer the ground voltage providing a virtual ground, maintaining a stable reference point for the measurement circuits. In addition to its role as a voltage reference, the vgnd buffer may also play a role in controlling the current flow through the measurement resistors and the load.

Block 5 105 may form the high voltage gain stage. This block may further amplify the error signal from Block 1 to a level capable of controlling the load voltage. It may be connected to high voltage sources and may play a crucial role in the feedback mechanism for maintaining the desired load voltage. The voltage output may be used to adjust the output voltage, while the current output may directly modulate the current flow through the load. This dual-output configuration may allow for precise and independent control of both voltage and current in the system, enhancing its ability to adapt to various load conditions and measurement requirements.

Block 6 106 may form a low leakage high voltage divider for feedback purposes. This block may allow the low voltage circuitry to monitor and control the high voltage output, providing a scaled-down version of the high voltage for use in the feedback loop.

Together, these blocks may work in concert to provide accurate current measurement across multiple ranges, with the ability to handle both small and large currents simultaneously without the need for manual range switching.

The operation of the auto-ranging circuit 100 will now be described in more detail, starting from the setting of the desired voltage to the balancing of the feedback and measurement of the load current.

The desired voltage source V2 may set the target load voltage. This voltage serves as a reference point for the system, determining the desired operating condition for the load being measured. The voltage set by V2 may be used as an input to the feedback loop, allowing the system to adjust its operation to maintain this desired voltage across the load. In some aspects, the desired voltage source V2 may be set by a user or controlled automatically by an external controller not shown in the circuit diagram, thereby allowing the system to dynamically adjust its operation to maintain this desired voltage across the load.

Block 3 103 may include resistors R1 and R2, which form the comparison node of the main loop feedback network. These resistors create a voltage divider that may compare the desired voltage set by V2 with the actual load voltage. The output of this comparison is a low voltage signal that represents the difference between the desired and actual load voltages. This error signal is beneficial for the system's feedback mechanism, as it drives the subsequent stages to adjust the load voltage to match the desired settings.

Block 1 101 may include amplifiers U1 and U2, along with capacitor C1. This block may be as the low voltage gain stage for the main feedback loop. Amplifier U1 may be connected to a voltage source V7 and V8 which produce voltages +V and −V, while U2 may be connected to low voltage sources V3 and V4 which produce low voltages +VL and −VL. The amplifiers in this block amplify the error signal from Block 3 103, increasing its magnitude to a level suitable for driving the subsequent high voltage gain stage. This error signal may be output as an output signal to Block 5 105.

Block 5 105 may include amplifier U7, resistors R18, R19, R20, and R21, and capacitors C8 and C9. This block forms the high voltage gain stage and is connected to high voltage sources V5 and V6 which produce high voltages +VH and −VH. The amplified error signal from Block 1 101 is further amplified in this stage to a level capable of controlling the load voltage.

In some aspects, the output of the high voltage gain stage in Block 5 105 may be connected to the vgnd of the circuit. This connection allows the amplified error signal to directly influence the current in the vgnd amplifier U8, which in turn affects the current flow through the load. By adjusting the vgnd current, the system can effectively control the load current to maintain the desired voltage across the load.

As the amplified error signal from Block 5 105 modulates the vgnd current, it may cause corresponding changes in the current flowing through the load. This arrangement may allow for precise and dynamic control of the load current in response to variations in the load voltage or changes in the desired voltage set point.

In some implementations, additional circuitry (not shown) may be included between the output of Block 5 105 and the vgnd node to further condition the signal or provide additional control features. For example, current limiting or slew rate control components may be incorporated to ensure smooth transitions and prevent sudden changes in the load current that may potentially damage sensitive devices under test.

Block 4 104 may include amplifier U8, voltage sources V7 and V8 and capacitors C10 and C11. This block acts the vgnd buffer and provides a stable interface between the ranging arrangement and the high voltage gain stage. The amplifier U8 may buffer the virtual ground voltage on C11, maintaining a stable reference point for the measurement circuits.

The amplifier U8 may be configured as a unity-gain buffer, providing a low-impedance output that can drive the subsequent stages of the circuit without loading the virtual ground node. This buffering action may help isolate the virtual ground from noise and disturbances that may otherwise affect the measurement accuracy.

In this example, Block 2 102 is shown to have two measurement stages. Stage 1 102A may include amplifiers U4 and U5, resistors R9, R10, R11, R12, R13 and R14, capacitors C5 and C6, and diodes D5 and D6. Stage 2 102B may include amplifier U3, resistors R3, R4, R5, R6, R7, and measurement resistor R8, capacitors C2, C3, C4, and C7, and diodes D1, D2, D3, D4, D7 and D8. These stages may be designed to measure different ranges of load current. As the input current increases, Stage 1 102A activates to measure a lower current range, while Stage 2 102B activates to measure a higher current range. The multiple stages allow for simultaneous measurement across different current ranges without switching, providing continuous measurement capability.

In some aspects, a logarithmic scale of measurement ranges may be implemented through the selection of circuit values, particularly the measurement resistors in each sensing circuit. For example, the measurement resistor in the low range measurement stage may have a value that is ten times larger than the measurement resistor in the high range measurement stage. This configuration allows the low range stage to measure currents that are one-tenth the magnitude of those measured by the high range stage. Additional stages may be added with measurement resistors scaled by factors of ten, creating a logarithmic progression of measurement ranges. This logarithmic scaling may enable the system to accurately measure currents spanning several orders of magnitude, from microamps to amps, without the need for manual range switching or interruption in measurement. These features may make the system particularly useful in various applications, such as electronics testing, power management, and scientific research, where accurate and reliable current measurement is beneficial.

In other words, the auto-ranging circuit may be expanded to include more than two measurement stages by duplicating the circuitry found in Stage 2 102B and connecting it to the output of diode D7 in the same way that Stage 2 102B is connected to D7. These additional stages may be designed to measure progressively higher current ranges, with each new stage featuring a measurement resistor of a different size. A distinction between these new stages and the existing Stage 2 102B may be the value of their respective measurement resistors, which may be selected to accommodate the desired current range for each stage (e.g. progressively smaller resistors to measure progressively larger ranges). This modular approach to expanding the measurement capabilities of the circuit allows for a highly scalable and customizable system, capable of measuring an even wider range of currents with maintained accuracy and without the need for manual range switching.

Block 6 106 may include amplifier U9, resistors R23 and R24, and capacitors C12 and C13 where C13 may represent the load capacitance. This block forms a low leakage high voltage divider for feedback purposes to allow the low voltage circuitry to monitor and control the high voltage output. The resistors R23 and R24 form the voltage divider. Amplifier U9 may buffer the divided voltage, providing a low-impedance output for the feedback loop to Block 3 103.

Having described the components and functionality of the auto-ranging circuit, an example use case of the system will now be explained to illustrate how these various elements work together to achieve accurate current measurement across multiple ranges. This example demonstrates the dynamic behavior of the circuit, showing how it responds to changes in load current and maintains precise control through its feedback mechanisms, providing a practical understanding of the system's capabilities in real-world scenarios.

To operate the circuit, the user may first connect a DUT to the circuit as the load. The user may then adjust the desired voltage source V2 to set the target voltage for the load. This voltage serves as the reference point for the system, determining the desired operating condition for the DUT.

Block 3 103, containing resistors R1 and R2, forms the comparison node of the main loop feedback network. These resistors create a voltage divider that compares the desired voltage set by V2 with the actual load voltage. The output of this comparison is a low voltage signal "output" representing the difference between the desired and actual load voltages, effectively generating an error signal.

This error signal may then be fed to Block 1 101, which serves as the low voltage gain stage for the main feedback loop. Block 1 101, including amplifiers U1 and U2 amplify the error signal from Block 3 103. This amplification increases the magnitude of the error signal to a level suitable for driving the subsequent high voltage gain stage in Block 5 105.

Block 5 105, including amplifier U7 forms the high voltage gain stage. The amplified error signal from Block 1 101 is further amplified in this stage to a level capable of controlling the load current. Block 5 may produce two outputs: a voltage output and a current output. The voltage output may be connected to the vgnd node of the circuit, allowing the amplified error signal to directly influence the voltage at the output node. The current output may be used to control the load current. This dual-output configuration may enable the system to simultaneously adjust both the output voltage and the load current. By modulating the voltage output and controlling the current, the system may achieve precise and dynamic control of the load conditions in response to variations in the load or changes in the desired voltage set point.

The amplified error signal injected into vgnd flows through the buffer in Block 4 104, which includes amplifier U8 and buffer capacitor C11. This buffer provides a stable interface between the ranging arrangement and the high voltage gain stage. The voltage on capacitor C11 in Block 4 104 stores the buffer voltage having an amplitude that determines which measurement stages in Block 2 102 are activated.

Amplifier U5 in Block 2 102 responds to the voltage on C11 by outputting a voltage that may trigger only Stage 1 102A when the voltage is below a certain voltage threshold. In other words, Stage 2 102B may not yet be triggered because the voltage output by U5 is not large enough to activate it. This arrangement allows the circuit to measure lower current ranges solely using Stage 1 102A while keeping Stage 2 102B inactive, providing an efficient and accurate measurement system for varying load currents.

In some aspects, the current flowing through measurement resistor R14 of Stage 1 102A in Block 2 102 may follow a specific path within the circuit. This current may flow from R14 to system ground and then through the DUT. From the DUT load, the current may return to the high voltage sources V5 and V6 in Block 5 105, completing the current loop.

The voltage drop across measurement resistor R14 may be proportional to the current flowing through the DUT providing a direct representation of the current flowing through the DUT. In other words, by measuring the voltage across R14, the system can determine the load current with high precision, especially for lower current ranges where Stage 1 102A is active.

As previously discussed, this arrangement may allow the circuit to accurately measure load currents across a wide range of magnitudes. For example, as the load current increases beyond the measurement range of R14, the voltage output by U5 may be large enough such that Stage 2 102B may activate, utilizing measurement resistor R8 to measure higher current ranges. This multi-stage approach enables the system to maintain measurement accuracy across its operating range without the need for manual switching or interruption in the measurement process.

In other words, if at some point, the controller or user increases the desired voltage source V2 to a certain level, this may cause an increase in the load current. As the vgnd current rises, it may lead to an increase in the output of amplifier U5 in Block 2 102. When the output of U5 reaches a specific threshold, it may trigger Stage 2 102B to start measurements alongside Stage 1 102A.

At this point, both Stage 1 102A and Stage 2 102B may both be actively measuring the load current simultaneously. When these measurement values (e.g., measure_1 and measure_2) are summed together, they may be equivalent to the total load current flowing through the DUT.

This multi-stage measurement approach may allow the circuit to maintain high accuracy across a wide range of load currents. As the load current increases beyond the measurement range of Stage 1 102A, Stage 2 102B may progressively contribute more to the total measurement, ensuring that the system can accurately measure larger currents without sacrificing precision at lower current levels. The seamless transition between measurement stages may occur without any manual intervention or switching, potentially eliminating discontinuities or gaps in the measurement process.

In some implementations, Stage 2 102B may be triggered when Stage 1 102A reaches a predetermined (e.g. maximum) level, such as 50% of its full-scale measurement range, which may be set by the designer of the circuit. This threshold may be chosen to optimize the measurement accuracy and dynamic range of the system. When Stage 1 102A approaches this predetermined level, it may indicate that the load current is nearing the upper limit of Stage 1 102A's measurement capability. By activating Stage 2 102B at this point, the circuit may ensure a smooth transition between measurement ranges, maintaining accuracy across the range of load currents. This design approach may allow for efficient utilization of both stages, providing increased performance and preventing potential measurement errors that may occur if Stage 1 102A were to operate too close to its maximum measurement limit.

In some aspects, the auto-ranging circuit may also incorporate a voltage offset (voffset) feature to control the operation of measurement stages. This voffset may be implemented as an adjustable voltage source connected to the input of each measurement stage, allowing for fine-tuning of the activation thresholds for different current ranges. By adjusting the voffset, the circuit designer may optimize the performance of each measurement stage, ensuring that they operate within their most accurate and linear regions. In another example, voffset may be used to zero the non-triggered circuits to ensure that they do not contribute to the overall measurement. In other words, when Stage 2 102B has not yet been triggered, voffset can ensure that Stage 2 102B does not have any output on measure_2.

In other words, the voffset feature may provide several benefits to the overall system performance. For instance, it may allow for compensation of component tolerances and variations in circuit behavior across different operating conditions. Additionally, the voffset may be used to shift the measurement range of each stage, enabling more precise control over the current levels at which different stages activate. This flexibility may be particularly useful in applications where specific current thresholds are beneficial, or when adapting the circuit to measure different types of loads with varying current characteristics.

It is noted that in typical electronic circuits, leakage currents are often considered problematic as they can introduce errors in measurements and reduce overall system efficiency. However, in the auto-ranging circuit illustrated in FIG. 1, leakage currents do not pose a significant issue due to the design that incorporates system ground as part of the feedback loop.

The circuit's design allows for leakage currents to flow through the system ground, effectively becoming part of the measurement and control loop. This arrangement ensures that any leakage current is accounted for in the overall current measurement, rather than introducing errors or uncontrolled losses. By integrating the system ground into the feedback mechanism, the circuit can compensate for leakage currents, maintaining accurate measurements across the range of operation. This approach not only mitigates the potential negative effects of leakage but also contributes to the circuit's ability to provide precise and reliable current measurements across multiple ranges without the need for manual switching or range adjustments.

In the auto-ranging circuit, leakage currents may flow through various components, including, for example, amplifier U1 (leak1), voltage sources V7/V8 (leak2), capacitor C11 (leak3), amplifiers U8 (leak4) and U9 (leak6), and high voltage sources V5/V6 (leak5). The circuit's design may account for these leakage currents in several ways. For example, the circuit's design may account for these leakage currents by incorporating them into the feedback loop and allowing them to flow through the system ground. This approach may enable the leakage currents to be part of the overall current measurement, potentially minimizing their impact on measurement accuracy. The use of high input impedance components and low-leakage designs in critical areas may further help to reduce the effects of leakage currents on the system's performance.

By allowing these leakage currents to flow through the system ground and incorporating them into the feedback mechanism, the circuit may maintain accurate measurements across its operating range. This approach may enable the auto-ranging circuit to provide precise and reliable current measurements across multiple ranges without the need for manual switching or range adjustments, even in the presence of various sources of leakage current.

Figure 2A:
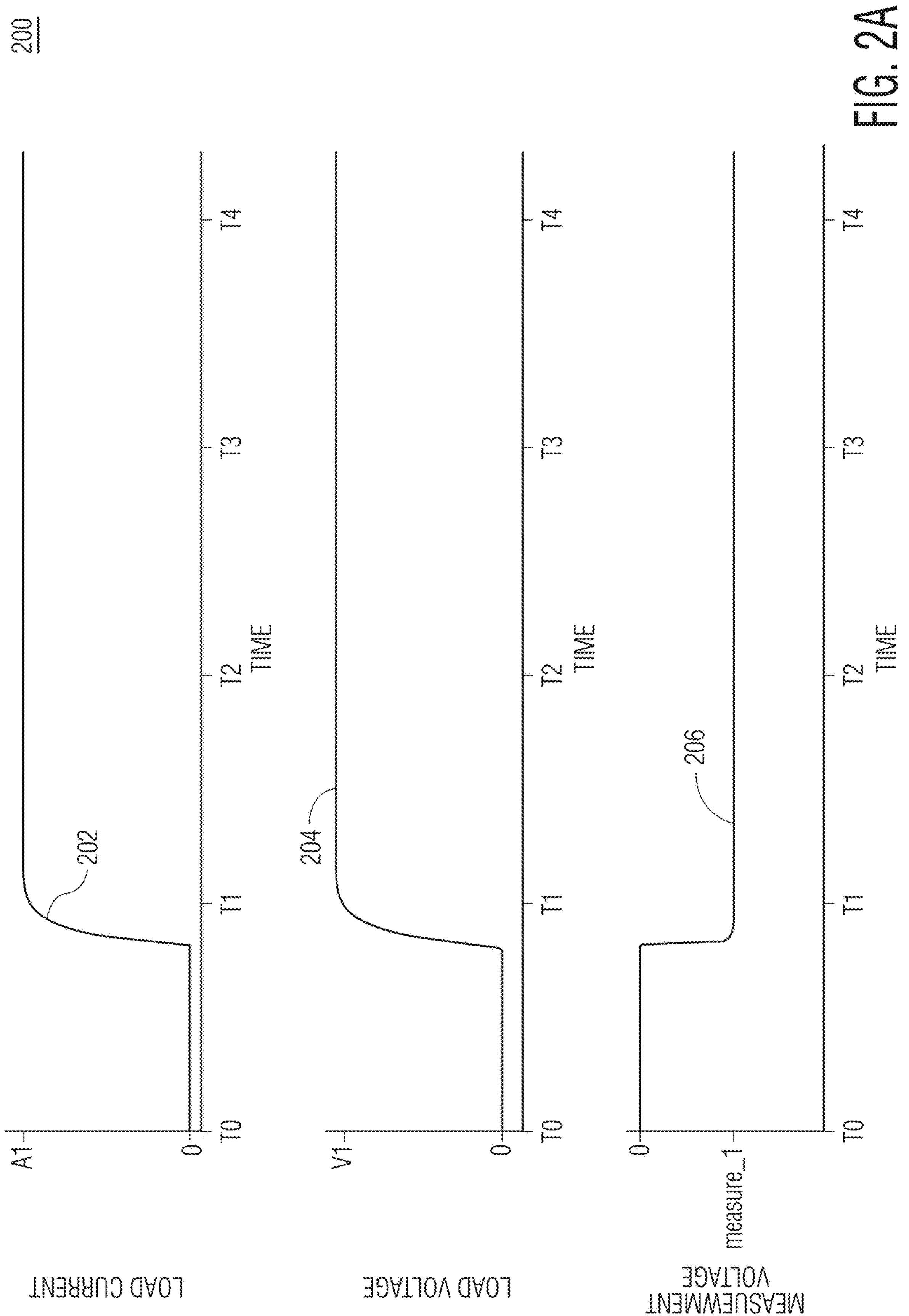
FIG. 2A depicts a timing chart showing relationships between load current, load voltage, and measurement voltage, according to an embodiment.

Some examples of measurement voltages will be described in reference to FIGS. 2A and 2B. These figures illustrate timing charts that demonstrate the relationship between load current, load voltage, and measurement voltages over time. FIG. 2A shows a simplified scenario with a single measurement current, while FIG. 2B expands on this concept by depicting multiple (e.g. two) measurement ranges, providing a more comprehensive view of how the auto-ranging circuit responds to changes in load conditions across different current magnitudes.

Referring to FIG. 2A, a timing chart 200 is depicted, illustrating the relationships between load current, load voltage (vout), and measurement voltage over time. The timing chart 200 consists of three graphs having a common time axis, each representing a different parameter. The load current curve 202 shows an initial constant current A1 that rapidly increases to a higher constant value at time T1. The load voltage curve 204 displays an initial zero voltage that quickly rises to a constant value V1 at time T1, coinciding with the change in load current. The measurement voltage curve 206 illustrates an initial zero voltage that drops to a constant negative value measure_1 at time T1, corresponding to the changes observed in the load current and load voltage curves. The three curves maintain their respective constant values from time T1 through T4, demonstrating the system's response to a change in load conditions.

In this example, the load current and load voltage were only large enough to trigger the Stage 1 102A measurement measure_1, while not being sufficient to activate Stage 2 102B. Consequently, the measurement voltage measure_2 for Stage 2 102B is not shown in the timing chart because it remains at zero throughout the measurement period. This scenario demonstrates the auto-ranging circuit's ability to selectively engage measurement stages based on the magnitude of the input signals, allowing for accurate measurements within the range of Stage 1 102A without unnecessarily activating higher measurement ranges.

Figure 2B:
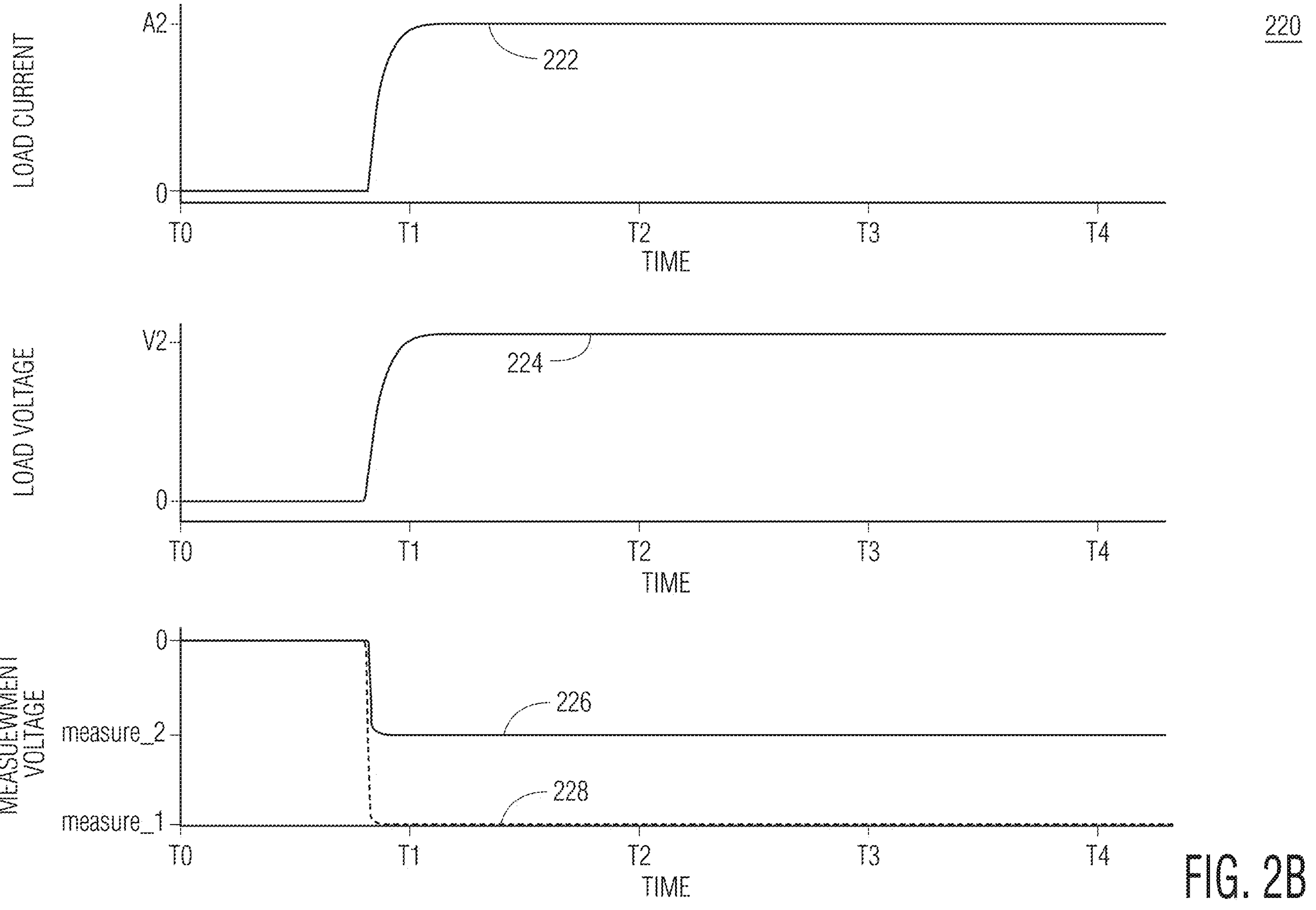
FIG. 2B illustrates a timing chart displaying load current, load voltage, and measurement voltages for multiple ranges, according to aspects of the present disclosure.

Referring now to FIG. 2B, a timing chart 220 is depicted, illustrating the system's response to changes in load conditions across multiple measurement ranges. The load current curve 222 shows an initial high value that rapidly increases to a steady-state value A2 at time T, where A2 is larger than A1 from FIG. 2A. The load voltage curve 224 displays an initial zero voltage that quickly rises to a steady-state value V2 at time T1, coinciding with the change in load current. V2 is also larger than V1 from FIG. 2A, which triggers the activation of the second measurement stage. The timing chart 220 also includes two measurement voltage curves: a high range measurement curve 226 and a low range measurement curve 228. The high range measurement curve 226 starts at zero, then jumps to a value measure_2 at time T1 and remains constant, reflecting the activation of the second stage due to the larger A2 and V2 values.

Although a specific polarity example is shown in FIGS. 2A and 2B, it is noted that the auto-ranging circuit may be designed to operate effectively regardless of the polarity of the load current and voltage. In other words, the measurement circuit may be capable of accurately measuring both positive and negative load currents and voltages without requiring any manual reconfiguration or switching. This bidirectional measurement capability may be achieved through the use of differential amplifiers and appropriate circuit design techniques that allow the system to respond symmetrically to both positive and negative input signals. As a result, the auto-ranging circuit may provide consistent and reliable measurements even in applications where the current flow or voltage polarity may reverse, such as in bidirectional power systems or during transient events, enhancing the versatility and robustness of the measurement system across a wide range of operating conditions.

Figure 3:
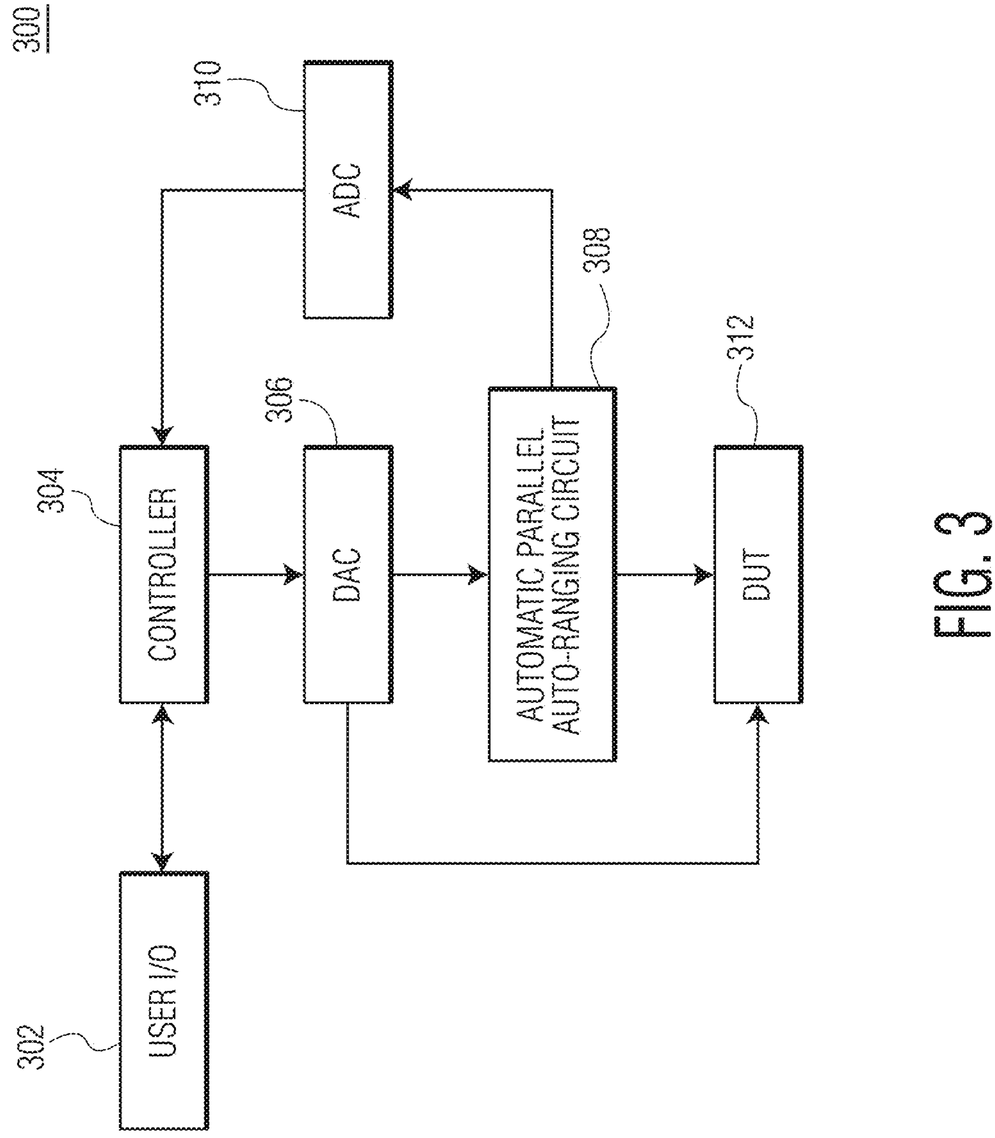
FIG. 3 shows a block diagram of a test system for testing a device under test, according to an embodiment.
Figure 4:
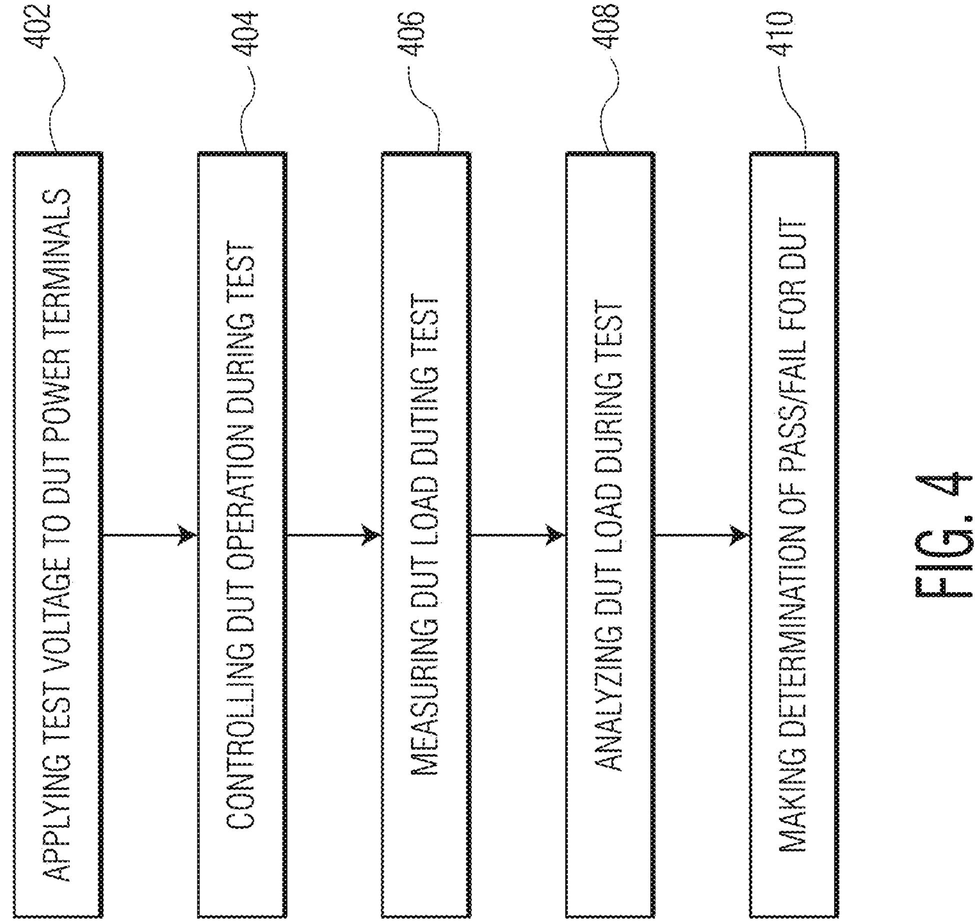
FIG. 4 presents a flowchart of a method for testing a device under test, according to aspects of the present disclosure.

The hardware setup for using the auto ranging circuit to test a DUT and the method for using the auto ranging circuit to test the DUT are now explained with respect to FIGS. 3 and 4. FIG. 3 illustrates a block diagram of a test system that incorporates the auto-ranging circuit for current measurement, while FIG. 4 presents a flowchart outlining the steps involved in the testing process. These figures provide a comprehensive overview of both the physical components for testing and the logical sequence of operations performed during the test, offering an understanding of how the auto-ranging circuit is integrated into a practical testing environment and utilized to evaluate the performance of a DUT.

Referring to FIG. 3, a test system 300 is depicted, which may include the auto-ranging circuit 100 for testing DUT 312 which may be a wide variety of electronic components, circuits, or systems that benefit from precise current measurement for testing or characterization. In some aspects, the DUT 312 may be a semiconductor device, such as an integrated circuit, microprocessor, or power transistor. In other cases, the DUT 312 may be a complete electronic module or subsystem, such as a power supply unit, battery management system, or motor controller.

DUTs may have varying current requirements or operating modes. For example, the DUT 312 may be a mobile device processor that operates in different power states, from low-power sleep modes to high-performance active modes. In such cases, the auto-ranging capability of the circuit may allow for accurate current measurements across operating conditions without the need for manual range switching.

In some implementations, the DUT 312 may be a power semiconductor device, such as a MOSFET or IGBT, where precise characterization of on-state resistance, switching losses, and leakage currents is beneficial. The wide measurement range and high accuracy of the auto-ranging circuit may enable comprehensive testing of these parameters across different operating voltages and temperatures.

The DUT 312 may also be a complex system-on-chip (SoC) that integrates various functional blocks with different power consumption characteristics. In this case, the auto-ranging circuit's ability to measure both small and large currents simultaneously may be particularly beneficial for analyzing the power distribution and efficiency of different parts of the SoC.

In some aspects, the DUT 312 may be an energy harvesting device or a renewable energy system component, such as a solar cell or thermoelectric generator. For these applications, the auto-ranging circuit's capability to measure both positive and negative currents may be beneficial for characterizing the device's performance under various environmental conditions and load scenarios.

The system may also include a user interface 302 that allows for user input and output. This user interface 302 may be a graphical user interface, a command line interface, or any other type of interface that allows a user to interact with the test system 300 to set the desired load voltages/currents. In some cases, the user interface 302 may also provide visual feedback to the user, such as displaying the current through the DUT 312 or the voltage across the DUT 312. In other words, the user interface allows the technician to perform the test and view the results.

The user interface 302 is connected to a controller 304, which manages the overall operation of the test system 300. The controller 304 may be a microcontroller, a microprocessor, a digital signal processor, or any other type of processing device capable of controlling the operation of the test system 300. In some aspects, the controller 304 receives test commands from the user interface 302 and sends measurements back to it.

The controller 304 is connected to a digital-to-analog converter (DAC) 306. The controller 304 sends test voltage instructions and DUT operational instructions to the DAC 306. The DAC 306 converts these digital instructions into analog signals to set the test voltage. In some cases, the DAC 306 may be a standalone device, or it may be integrated into the controller 304 or another component of the test system 300.

The auto-ranging circuit 308 is connected to the DAC 306. This circuit 308 receives the set test voltage from the DAC 306 and supplies the test voltage to the DUT 312. The DUT 312 may be connected to both the auto-ranging circuit 308 and the controller 304. The controller 304 sets the desired voltage by adjusting V2 in FIG. 1, which initiates the testing process. Once the desired voltage is set, the auto-ranging circuit 308 may begin supplying test current to the DUT 312. This arrangement allows for precise control over the test conditions, with the controller 304 determining the target voltage and the auto-ranging circuit 308 managing the current supply and measurement across multiple ranges simultaneously.

It is noted that in addition to setting the desired voltage and initiating the testing process, the controller 304 may also control the DUT operation during the test. This control may involve sending specific commands or signals to the DUT 312 to change its operating mode, adjust its internal parameters, or trigger specific functions. For example, the controller 304 may instruct the DUT 312 to switch between different power states, execute particular operations, or simulate various load conditions. This capability allows for comprehensive testing of the DUT's performance under different operating scenarios, enabling a more thorough evaluation of its functionality and efficiency across its operating range. The controller's ability to dynamically adjust the DUT's operation during the test may also facilitate automated test sequences, where the DUT is put through a series of predefined operational states without the need for manual intervention.

In either case, the analog-to-digital converter (ADC) 310 may be connected to the auto-ranging circuit 308 and the controller 304. The ADC 310 receives DUT load measurements from the auto-ranging circuit 308, converts these analog measurements to digital form, and sends them to the controller 304 as measurement data. In some aspects, the ADC 310 may be a standalone device, or it may be integrated into the controller 304 or another component of the test system 300.

The system may operate in a closed loop, with the controller 304 managing the test process, the DAC 306 and auto-ranging circuit 308 applying test conditions to the DUT 312, and the ADC 310 feeding data representing measurement results back to the controller 304 for analysis and user display. This closed-loop operation allows for precise control over the test conditions and accurate measurement of the DUT load.

In some embodiments, the test system 300 may include additional components or features not shown in FIG. 3. For example, the test system 300 may include an auxiliary power supply for providing power to the DUT 312, a temperature control system for controlling the temperature of the DUT 312 during testing, or a data storage device for storing test results. The specific configuration of the test system 300 may vary depending on the specific requirements of the testing application.

Referring to FIG. 4, a method 400 may begin with step 402, which involves applying test voltage to DUT power terminals. In some aspects, this step may be performed by DAC 306, which receives test voltage instructions from a controller 304 and converts these digital instructions into analog signals to set the test voltage. The DAC 306 may then supply this test voltage to the DUT via an auto-ranging circuit 308.

Following this, the process moves to step 404, which may entail controlling DUT operation during the test. In some cases, this step may be performed by the controller 304, which sends DUT operational instructions to the DUT. The controller 304 may control various aspects of the DUT operation, such as the timing of the test, the sequence of operations performed by the DUT, or the parameters of the test conditions.

After controlling the DUT operation, the method 400 proceeds to step 406, where measuring DUT load during the test takes place. In some aspects, this step may be performed by the auto-ranging circuit 308, which measures the voltage across the measurement resistors and converts this voltage into a current measurement that reflects the current flowing through the DUT. The auto-ranging circuit 308 may measure the DUT load parameters across multiple ranges simultaneously, providing a comprehensive measurement of the DUT load parameters.

Step 408 may then analyze the DUT load during the test. In some cases, this step may be performed by the controller 304, which receives the DUT load measurements from the auto-ranging circuit 308 via ADC 310. The controller 304 may analyze these measurements to determine various characteristics of the DUT, such as its performance, efficiency, or reliability.

In some implementations, the analysis performed by the controller 304 may involve complex data processing techniques to extract meaningful insights from the DUT load measurements. For instance, the controller may employ statistical analysis methods to identify trends, patterns, or anomalies in the load data over time. This may include calculating average power consumption, peak current draw, or power factor for different operational modes of the DUT.

The controller 304 may also perform frequency domain analysis on the load measurements, using techniques such as Fast Fourier Transform (FFT) to identify harmonic content or noise characteristics in the DUT's power consumption. This analysis may be particularly useful for evaluating the electromagnetic compatibility (EMC) performance of the DUT or identifying potential sources of interference.

In some cases, the controller 304 may compare the analyzed data against predefined performance criteria or specifications. This comparison may involve checking if the DUT's power consumption falls within acceptable limits, if its efficiency meets target values, or if its transient response characteristics are within specified tolerances. The controller may use these comparisons to generate pass/fail criteria for the DUT or to flag potential issues for further investigation.

The analysis may also include correlation of load measurements with other test parameters, such as temperature, input voltage variations, or specific operational states of the DUT. This correlation analysis may help identify dependencies or sensitivities in the DUT's performance, providing beneficial insights for design optimization or reliability assessment.

In some implementations, the controller 304 may employ machine learning algorithms to analyze the load data. These algorithms may be trained on historical test data to recognize patterns indicative of normal operation or potential defects. This approach may enable more sophisticated anomaly detection or predictive maintenance capabilities, especially for complex DUTs with multiple operating modes or long-term reliability requirements.

The controller 304 may also generate visual representations of the analyzed data, such as graphs, charts, or heat-maps, to facilitate easier interpretation of the results. These visualizations may be displayed on the user interface 302, allowing test engineers to quickly identify trends or issues in the DUT's performance.

In some aspects, the analysis may extend beyond individual DUT performance to compare results across multiple units of the same type. This statistical analysis of a population of DUTs may help identify manufacturing variations, potential quality control issues, or opportunities for process improvement.

The depth and complexity of the analysis performed by the controller 304 may be configurable based on the specific requirements of the test application. This flexibility allows the test system to be adapted for various types of DUTs and testing scenarios, from simple go/no-go tests to detailed characterization of complex electronic systems.

Step 410 may then include making a determination of pass/fail for the DUT. This step may use the data collected and analyzed in the previous steps to assess the performance of the DUT against predetermined criteria. In some aspects, the pass/fail determination may be made by the controller 304, which may compare the DUT load measurements to a set of predefined thresholds or benchmarks to determine whether the DUT has passed or failed the test.

In some implementations, the pass/fail determination process may involve multiple criteria and complex decision-making algorithms. The controller 304 may evaluate various performance metrics simultaneously, such as power consumption, response time, output accuracy, and stability across different operating conditions. These metrics may be weighted differently based on their importance to the overall functionality of the DUT.

The pass/fail criteria may also incorporate tolerance bands or acceptable ranges for each measured parameter. For instance, a DUT might pass if its power consumption is within ±5% of the expected value, its response time is below a certain threshold, and its output accuracy falls within a specified range. The controller 304 may be programmed to handle different levels of compliance, potentially categorizing results as "pass," "marginal pass," or "fail" based on how closely the DUT meets the ideal specifications.

In some cases, the pass/fail determination may be adaptive, taking into account statistical variations observed across multiple units of the same DUT type. This approach may help account for normal manufacturing variations while still identifying truly defective units. The controller 304 may update its pass/fail criteria based on accumulated test data, allowing for continuous refinement of the test process.

The pass/fail determination may also consider the intended application or operating environment of the DUT. For example, a DUT destined for use in harsh industrial environments might be subject to stricter pass/fail criteria than one intended for consumer electronics. The controller 304 may be configured to apply different sets of criteria based on the specific product variant or target market of the DUT being tested.

In some implementations, the pass/fail determination may include a series of conditional checks or decision trees. For instance, if a DUT fails a beneficial parameter test, it may be immediately classified as a fail without proceeding to further tests. Conversely, marginal performance in one area might trigger additional, more detailed tests to determine the final pass/fail status.

The controller 304 may also incorporate historical data and trend analysis into the pass/fail determination. If a DUT exhibits performance characteristics that, while within acceptable limits, deviate significantly from the norm established by previously tested units, it may be flagged for additional scrutiny or classified as a "conditional pass" pending further investigation.

In some aspects, the pass/fail determination may include a confidence level or uncertainty estimate. This may be particularly useful in cases where measurement noise or variability is a concern. The controller 304 may use statistical techniques to calculate the probability that a DUT truly meets the pass criteria, potentially flagging results with high uncertainty for manual review or retesting.

The results of the pass/fail determination may be communicated through various channels. In some implementations, the controller 304 may update the user interface 302 with a clear pass/fail indication, along with detailed test results and any relevant warnings or notes. For automated testing systems, the pass/fail result may trigger subsequent actions, such as sorting devices into appropriate bins, initiating additional tests, or updating production databases.

In some cases, the pass/fail determination may be part of a larger quality control process. The controller 304 may log test results, including pass/fail determinations, in a centralized database. This data may be used for statistical process control, identifying long-term trends in DUT performance, or triggering alerts if the pass/fail ratio falls below acceptable levels.

The pass/fail determination process may also include provisions for handling edge cases or unexpected results. The controller 304 may be programmed with decision-making algorithms to handle scenarios where DUT performance falls outside of anticipated parameters, potentially flagging these cases for human review or initiating specialized diagnostic routines.

It is noted that in some embodiments, the method 400 may include additional steps or variations not shown in FIG. 4. For example, the method 400 may include a step of calibrating the auto-ranging circuit 308 before the test, a step of adjusting the test voltage during the test, or a step of storing the test results for future analysis. The specific sequence and content of the steps in the method 400 may vary depending on the specific requirements of the testing application.

While the foregoing is directed to example embodiments described herein, other and further example embodiments may be devised without departing from the basic scope thereof. For example, aspects of the present disclosure may be implemented in hardware or software or a combination of hardware and software. Portions of the disclosure described herein may be implemented as a program product for use with a computer system. The program(s) of the program product defines functions of the example embodiments (including the methods described herein) and may be contained on a variety of computer-readable storage media. Illustrative computer-readable storage media include, but are not limited to: (i) non-writable storage media (e.g., read-only memory (ROM) devices within a computer, such as CD-ROM disks readably by a CD-ROM drive, flash memory, ROM chips, or any type of solid-state non-volatile memory) on which information is permanently stored; and (ii) writable storage media (e.g., floppy disks within a diskette drive or hard-disk drive or any type of solid-state random-access memory) on which alterable information is stored. Such computer-readable storage media, when carrying computer-readable instructions that direct the functions of the presented example embodiments, are example embodiments of the present disclosure.

It will be appreciated by those skilled in the art that the preceding examples are exemplary and not limiting. It is intended that all permutations, enhancements, equivalents, and improvements thereto are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A current measurement system, comprising:

a plurality of parallel sensing circuits, each sensing circuit configured to measure a respective range of voltage corresponding to a current through a load, wherein each sensing circuit is triggered to initiate measurement of a voltage across the load in response to a buffer current through a common buffer reaching a respective threshold;

a buffer circuit for inputting a virtual ground voltage or a virtual ground current to the load and to the plurality of parallel sensing circuits, the virtual ground voltage corresponding to the voltage across the load or the current through the load; and a processor coupled to the plurality of parallel sensing circuits, wherein the processor is configured to combine data representing voltage measurements from the plurality of parallel sensing circuits to determine the current through the load.

2. The current measurement system of claim 1, wherein each sensing circuit of the plurality of parallel sensing circuits comprises an amplifier with a predetermined gain, and wherein the respective threshold at which each sensing circuit of the plurality of parallel sensing circuits initiates the measurement is determined by the predetermined gain of its amplifier.

3. The current measurement system of claim 1, wherein the plurality of parallel sensing circuits are configured such that sensing circuits of the plurality of parallel sensing circuits measuring smaller ranges of the voltage across the load remain active when sensing circuits of the plurality of parallel sensing circuits measuring larger ranges of the voltage across the load or the current through the load are initiated.

4. The current measurement system of claim 1, wherein the respective ranges of the voltage across the load or the current through the load measured by the plurality of parallel sensing circuits are configured to collectively form a logarithmic scale of the measurement across the combined range of the system.

5. The current measurement system of claim 1, wherein the buffer circuit inputs the virtual ground voltage to an output of an amplifier, wherein the amplifier varies a voltage at its power terminals to provide the virtual ground voltage or the virtual ground current to the plurality of parallel sensing circuits.

6. The current measurement system of claim 1, wherein each sensing circuit of the plurality of parallel sensing circuits comprises an offset control configured to zero the respective sensing circuit of the plurality of parallel sensing circuits.

7. The current measurement system of claim 1, wherein a feedback loop is configured to adjust the virtual ground voltage or the virtual ground current of the plurality of parallel sensing circuits in response to changes in the current through the load.

8. The current measurement system of claim 1, wherein a feedback loop is configured to adjust the virtual ground voltage or the virtual ground current such that the voltage across the load or the current through the load corresponds to a desired reference voltage.

9. A method of measuring current, comprising:

measuring, by each of a plurality of parallel sensing circuits, a respective range of voltage corresponding to a current through a load, wherein each sensing circuit is triggered to initiate measurement of a voltage across the load or the current through the load in response to a buffer voltage or a buffer current on a common buffer reaching a respective threshold;

inputting, by a buffer circuit, a virtual ground voltage or a virtual ground current corresponding to the voltage across the load or the current through the load to the plurality of parallel sensing circuits; and combining, by a processor coupled to the plurality of parallel sensing circuits, data representing voltage measurements from the plurality of parallel sensing circuits to determine the current through the load.

10. The method of claim 9, wherein each sensing circuit of the plurality of parallel sensing circuits comprises an amplifier with a predetermined gain, and wherein the respective threshold at which each sensing circuit of the plurality of parallel sensing circuits initiates the measurement is determined by the predetermined gain of its amplifier.

11. The method of claim 9, wherein sensing circuits of the plurality of parallel sensing circuits measuring smaller ranges of the voltage across the load remain active when sensing circuits of the plurality of parallel sensing circuits measuring larger ranges of the voltage across the load or the current through the load are initiated.

12. The method of claim 9, wherein the respective ranges of the voltage across the load or the current through the load measured by the plurality of parallel sensing circuits collectively form a logarithmic scale of the measurement across the combined range of the plurality of parallel sensing circuits.

13. The method of claim 9, wherein inputting the virtual ground voltage comprises inputting the virtual ground voltage to an output of an amplifier, wherein the amplifier varies a voltage at its power terminals to provide an output voltage or the virtual ground current to the plurality of parallel sensing circuits.

14. The method of claim 9, further comprising zeroing each sensing circuit of the plurality of parallel sensing circuits using an offset control.

15. The method of claim 9, further comprising adjusting the virtual ground voltage or the virtual ground current of the plurality of parallel sensing circuits in response to changes in the current through the load.

16. The method of claim 9, further comprising adjusting the virtual ground voltage or the virtual ground current such that the voltage across the load or the current through the load corresponds to a desired reference voltage.

17. A method for testing operation of an electronic device, comprising:

measuring, by each of a plurality of parallel sensing circuits, a respective range of voltage corresponding to a current through the electronic device, wherein each sensing circuit is triggered to initiate measurement of a voltage across the electronic device in response to a buffer current through a common buffer reaching a respective threshold;

inputting, by a buffer circuit, a virtual ground voltage or a virtual ground current to the electronic device and to the plurality of parallel sensing circuits, the virtual ground current corresponding to the voltage across the electronic device or the current through the electronic device;

combining, by a processor coupled to the plurality of parallel sensing circuits, data representing voltage measurements from the plurality of parallel sensing circuits to determine the current through the electronic device; and analyzing the current to determine if the operation of the electronic device passes meets predetermined criteria.

18. The method of claim 17, wherein each sensing circuit of the plurality of parallel sensing circuits comprises an amplifier with a predetermined gain, and wherein the respective threshold at which each sensing circuit of the plurality of parallel sensing circuits initiates the measurement of the voltage across the electronic device is determined by the predetermined gain of its amplifier.

19. The method of claim 17, wherein sensing circuits of the plurality of parallel sensing circuits measuring smaller ranges of the voltage across the electronic device remain active when sensing circuits of the plurality of parallel sensing circuits measuring larger ranges of the voltage across the electronic device or the current through the electronic device are initiated.

20. The method of claim 17, wherein the respective ranges of the voltage across the electronic device or the current through the electronic device measured by the plurality of parallel sensing circuits collectively form a logarithmic scale of the measurement across the combined range of the plurality of parallel sensing circuits.

* * * * *